United States Patent
Hsiao et al.

(10) Patent No.: US 9,985,129 B2
(45) Date of Patent: May 29, 2018

(54) HIGH-VOLTAGE METAL-OXIDE-SEMICONDUCTOR TRANSISTOR AND FABRICATION METHOD THEREOF

(71) Applicant: UNITED MICROELECTRONICS CORP., Hsin-Chu (TW)

(72) Inventors: Shih-Yin Hsiao, Chiayi County (TW); Kuan-Liang Liu, Hsinchu County (TW); Ching-Chung Yang, Hsinchu (TW); Kai-Kuen Chang, Keelung (TW); Ping-Hung Chiang, Hsinchu (TW); Nien-Chung Li, Hsinchu (TW); Wen-Fang Lee, Hsinchu (TW); Chih-Chung Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/820,467

(22) Filed: Nov. 22, 2017

(65) Prior Publication Data

US 2018/0097104 A1    Apr. 5, 2018

Related U.S. Application Data

(62) Division of application No. 15/191,535, filed on Jun. 24, 2016, now Pat. No. 9,859,417.

(30) Foreign Application Priority Data

May 24, 2016   (TW) .............................. 105116152 A

(51) Int. Cl.
*H01L 21/336* (2006.01)
*H01L 29/78* (2006.01)
(Continued)

(52) U.S. Cl.
CPC ........ *H01L 29/7823* (2013.01); *H01L 21/033* (2013.01); *H01L 29/0619* (2013.01);
(Continued)

(58) Field of Classification Search
CPC ............... H01L 21/033; H01L 29/0619; H01L 29/0653; H01L 29/1095; H01L 29/4238;
(Continued)

(56) References Cited

U.S. PATENT DOCUMENTS 8,125,051 B2    2/2012  Chuang
8,592,945 B2   11/2013  Chuang
(Continued)

OTHER PUBLICATIONS

Hsiao, Title of Invention: Metal-Oxide-Semiconductor Transistor and Method of Forming Gate Layout, U.S. Appl. No. 14/952,877, filed Nov. 25, 2015.
(Continued)

*Primary Examiner* — Long K Tran
(74) *Attorney, Agent, or Firm* — Winston Hsu

(57) ABSTRACT

A high-voltage MOS transistor includes a semiconductor substrate, a gate oxide layer on the semiconductor substrate, a gate on the gate oxide layer, a spacer covering a sidewall of the gate, a source on one side of the gate, and a drain on the other side of the gate. The gate includes at least a first discrete segment and a second discrete segment. The first discrete segment is not in direct contact with the second discrete segment. The spacer fills into a gap between the first discrete segment and the second discrete segment.

7 Claims, 17 Drawing Sheets

(51) Int. Cl.
  *H01L 29/10* (2006.01)
  *H01L 29/66* (2006.01)
  *H01L 29/423* (2006.01)
  *H01L 29/06* (2006.01)
  *H01L 21/033* (2006.01)

(52) U.S. Cl.
  CPC ...... *H01L 29/0653* (2013.01); *H01L 29/1095* (2013.01); *H01L 29/4238* (2013.01); *H01L 29/66545* (2013.01); *H01L 29/66681* (2013.01)

(58) Field of Classification Search
  CPC ......... H01L 29/66545; H01L 29/66681; H01L 29/7823
  USPC .................................. 438/282; 257/339, 340
  See application file for complete search history.

(56) References Cited

U.S. PATENT DOCUMENTS

| | | |
|---|---|---|
| 2004/0169207 A1 | 9/2004 | Park |
| 2004/0227204 A1* | 11/2004 | Hebert .................. H01L 29/402 257/491 |
| 2010/0164018 A1 | 7/2010 | Lee |
| 2016/0351699 A1 | 12/2016 | Boos |
| 2017/0125584 A1 | 5/2017 | Zhang |

OTHER PUBLICATIONS

Hsiao, Title of Invention: Semiconductor Device, U.S. Appl. No. 14/995,174, filed Jan. 13, 2016.

\* cited by examiner

Trapezoid shape

L shape

HIGH-VOLTAGE METAL-OXIDE-SEMICONDUCTOR TRANSISTOR AND FABRICATION METHOD THEREOF

CROSS REFERENCE TO RELATED APPLICATIONS

This is a division of U.S. application Ser. No. 15/191,535 filed Jun. 24, 2016, which itself claims priority from Taiwan Patent Application Ser. No. 105116152 filed May 24, 2016. The above-mentioned applications are included in their entirety herein by reference.

BACKGROUND OF THE INVENTION

1. Field of the Invention

The present invention relates generally to the field of semiconductor devices. More particularly, the present invention relates to a high-voltage metal-oxide-semiconductor (HVMOS) transistor and a method for making the same.

2. Description of the Prior Art

With advances in technology, the related industry and technology of semiconductor integrated circuit (IC) has been grown rapidly. High voltage metal-oxide-semiconductor (HV MOS) transistor devices have been broadly utilized in CPU power supply systems, power management systems, AC/DC converters, LCD drivers, automobile electronic components, PC peripheral devices, PC peripheral devices, small DC motor controllers, and other consumer electronic devices due to being capable of enduring the high voltage provided by the electrical power system and having switching characterize together.

In another aspect, as the size of device shrinks continuously, metal gate has gradually replaced the conventional polycrystalline silicon material as being the control electrode that is configured with high dielectric constant dielectric layer. However, the issues of process integration occur when the metal gates are applied to some specific devices, such as memory devices and high voltage devices. For example, in a gate-last process for 28 nm or beyond, aluminum CMP (Al-CMP) may cause dishing defects to large-size gates, resulting in poor process yields and reduced electrical performance of the HVMOS devices.

SUMMARY OF THE INVENTION

It is one object of the invention to provide an improved high-voltage MOS transistor and fabrication method of making the same, which can be integrated with the high-k metal gate (HKMG) processes at 28 nm technology node or beyond, to thereby solve the above-mentioned prior art problems or shortcomings.

According to one aspect of the invention, a high-voltage MOS transistor is disclosed. The high-voltage MOS transistor includes a semiconductor substrate, a gate oxide layer on the semiconductor substrate, a gate on the gate oxide layer, a spacer covering a sidewall of the gate and filling into a gap between a first discrete segment and a second discrete segment, a source in the semiconductor substrate and on one side of the gate; and a drain in the semiconductor substrate and on the other side of the gate. The gate comprises at least the first discrete segment and the second discrete segment. The first discrete segment is not in direct contact with the second discrete segment According to another aspect of the invention, a method for fabricating a high-voltage MOS transistor is disclosed. A semiconductor substrate is provided. A gate oxide layer is formed on the semiconductor substrate. A dummy gate is then formed on the gate oxide layer. The dummy gate comprises at least a first dummy segment and a second dummy segment, wherein the first dummy segment is not in direct contact with the second dummy segment. A spacer is then formed on a sidewall of the dummy gate. The spacer fills into a gap between the first dummy segment and the second dummy segment. A contact etch stop layer (CESL) is formed on the first dummy segment, the second dummy segment, and the spacer. At least one dielectric layer is then deposited on the CESL. The dielectric layer and the CESL are polished to reveal the first dummy segment and the second dummy segment. The first dummy segment and the second dummy segment are removed to form a first gate trench and a second gate trench. A metal gate is formed in the first gate trench and the second gate trench.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
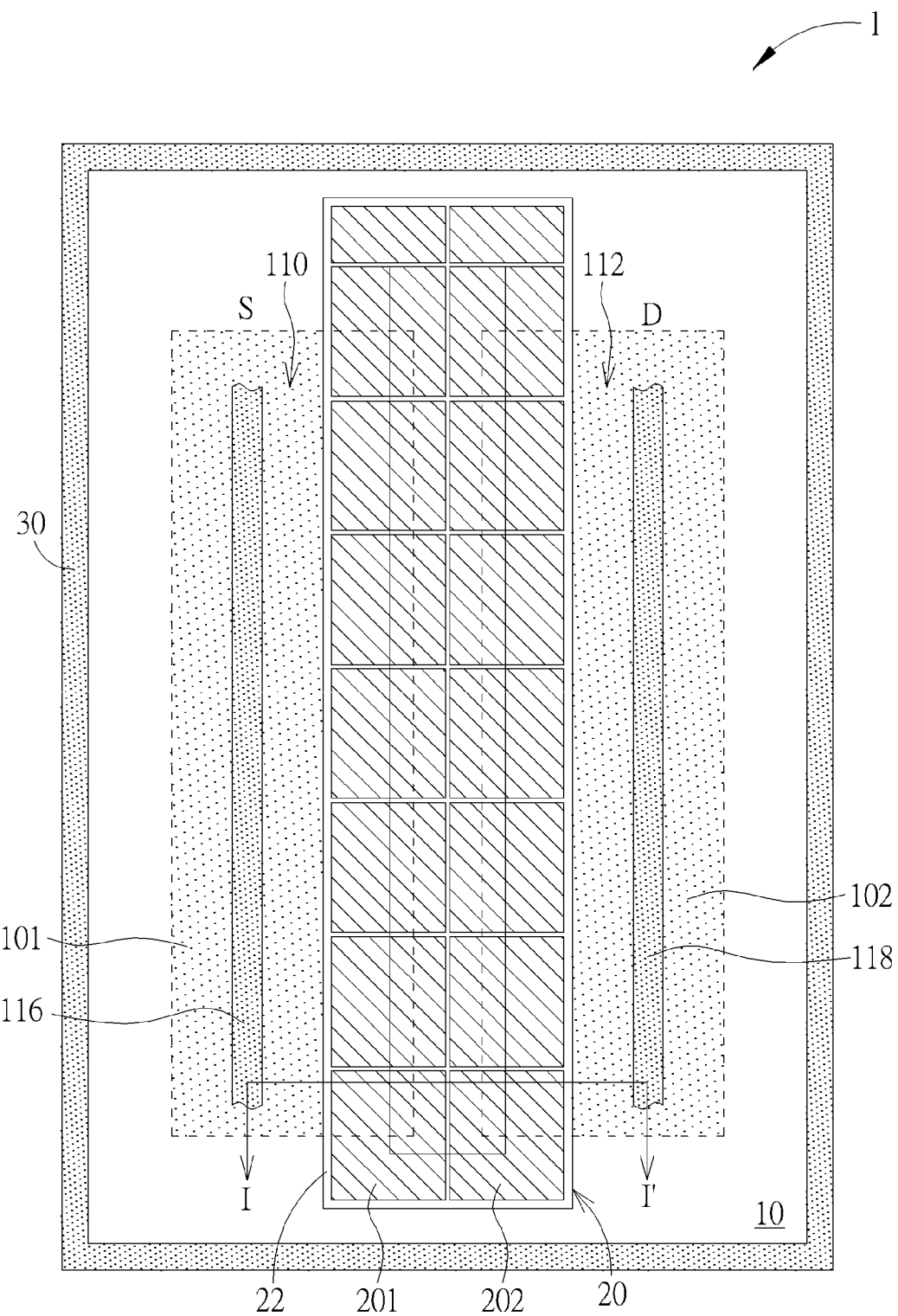
FIG. 1 is a schematic diagram illustrating a top view of a structure of a HVMOS transistor according to one embodiment of the present invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The present invention pertains to a high voltage metal-oxide-semiconductor (HVMOS) transistor having an operation voltage greater than 5 volts, such as several tens of volts, or a breakdown voltage of greater than 10 volts, such as several tens of volts or even several hundreds of volts. For example, the HVMOS transistor may be field-drift MOS (FDMOS) transistor or a double diffused drain MOS (DDD-MOS) transistor, but is not limited thereto.

Figure 2:
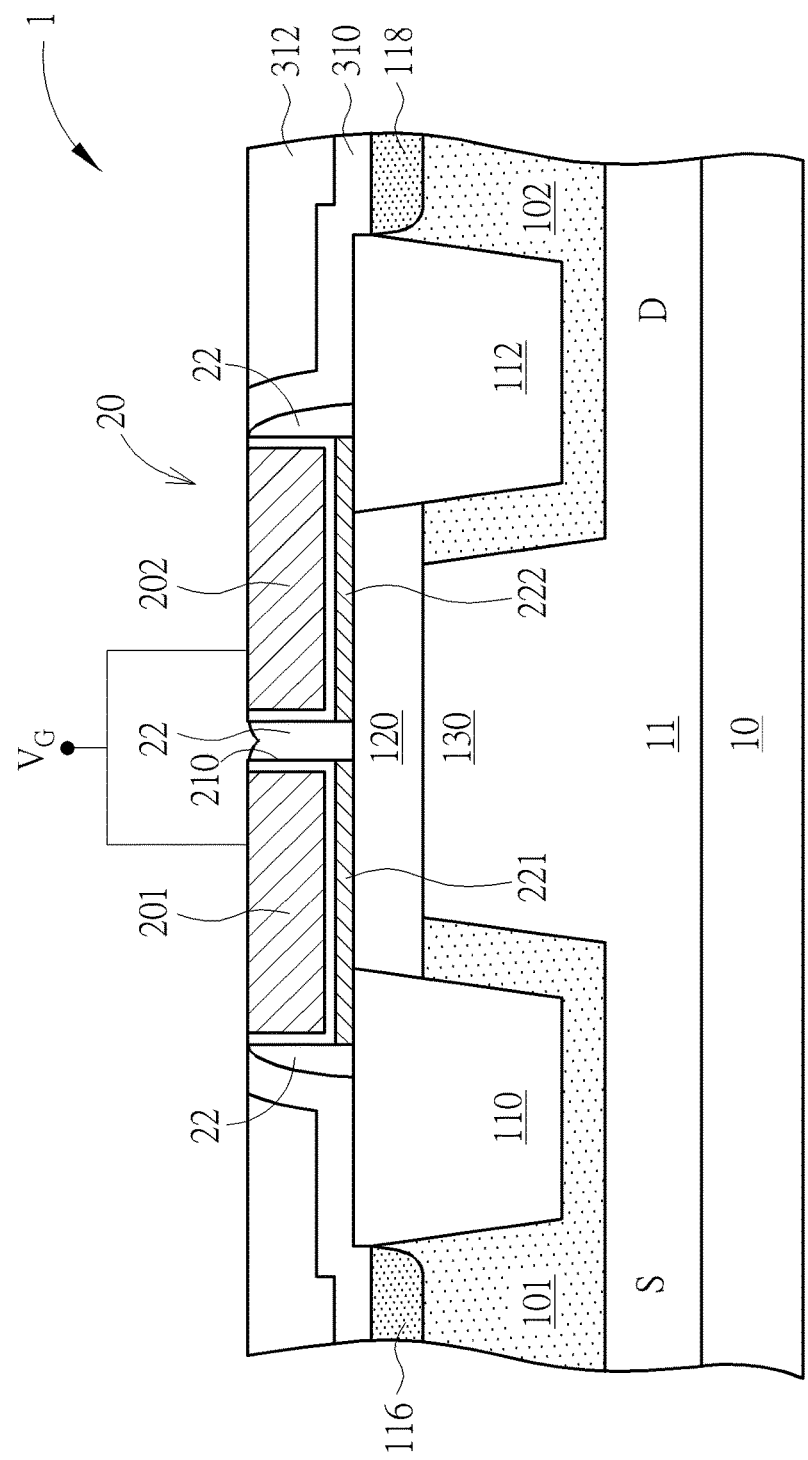
FIG. 2 is a schematic diagram illustrating a partial cross-sectional view of the HVMOS transistor taken along line I-I' in FIG. 1.

Please refer to FIG. 1 and FIG. 2. FIG. 1 is a schematic diagram illustrating a top view of a structure of a HVMOS transistor according to one embodiment of the present invention. FIG. 2 is a schematic diagram illustrating a partial cross-sectional view of the HVMOS transistor taken along line I-I' in FIG. 1. As shown in FIG. 1 and FIG. 2, according to the embodiment, the HVMOS transistor 1 comprises a semiconductor substrate 10, a gate oxide layer 120 disposed on a surface of the semiconductor substrate 10, and a gate 20 disposed on the gate oxide layer 120. According to the embodiment, the gate 20 is a metal gate.

According to the embodiment, the gate 20 comprises at least a first discrete segment 201 and a second discrete segment 202 that is disposed in close proximity to the first discrete segment 201. The first discrete segment 201 is not indirect contact with the second discrete segment 202. The first discrete segment 201 and the second discrete segment 202 are coplanar. Both of the first discrete segment 201 and the second discrete segment 202 comprise metal, for example, word function metal, barrier metal, low-resistance metal, or the like.

According to the embodiment, a first high dielectric constant (HK) layer 221 may be disposed between the first discrete segment 201 and the gate oxide layer 120, and a second high dielectric constant layer 222 may be disposed between the second discrete segment 202 and the gate oxide layer 120. According to the embodiment, the first high dielectric constant layer 221 is not in direct contact with the second high dielectric constant layer 222. According to the embodiment, the first high dielectric constant layer 221 and the second high dielectric constant layer 222 may comprise $HfO_x$, $HfSiO_x$, HfSiON, $ZrO_2$, $HfZrO_x$, $AlO_x$, or $TiO_x$, but is not limited thereto.

According to the embodiment, each sidewall of the gate 20 is covered with a spacer 22. A gap 210 between the first discrete segment 201 and the second discrete segment 202 is filled with the spacer 22. According to the embodiment, the gap 210 may be completely filled up with the spacer 22. According to the embodiment, the spacer 22 may comprise silicon oxide, silicon nitride, oxide-nitride-oxide (ONO), nitrogen-doped silicon carbide (SiCN), or the like. The gate oxide layer 120 may have a thickness between hundreds of angstroms and more than one thousand angstroms. The gate oxide layer 120 may be composed of silicon dioxide, but is not limited thereto.

Figure 17:
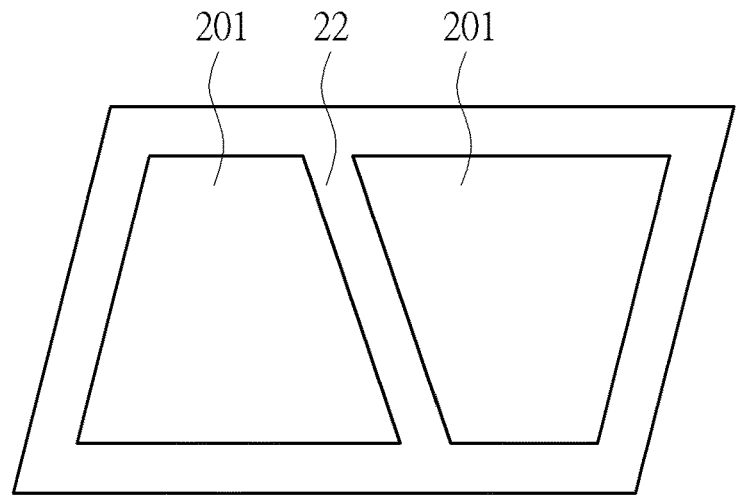
FIG. 17 is a schematic diagram illustrating a top view of a shape of a discrete segment according to another embodiment of the present invention.
Figure 17:
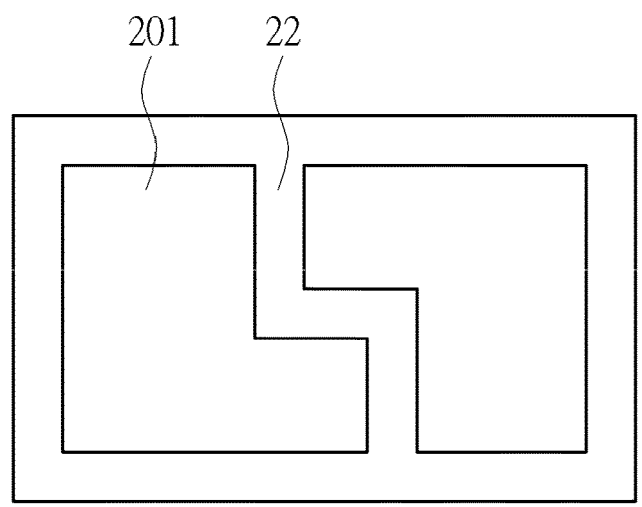

As can be seen in FIG. 1 the gate 20 is separated into a plurality of individual and discrete blocks including the first discrete segment 201 and the second discrete segment 202. When viewed form the above, each block may have a rectangular shape, for example. According to the embodiment, the maximum dimension of each block (e.g. the longer side of the rectangular shaped block) is smaller than or equal to a predetermined value, for example, 2 μm. According to the embodiment, it is not required that the blocks have the same size. However, it is preferred that each block has a surface area that is smaller than 3 μm2. According to another embodiment, as shown in FIG. 17, each block may have a shape other than rectangular shape, for example, trapezoid shape, L shape, or irregular shape.

According to the embodiment, the HVMOS transistor 1 may comprise a source S disposed in the semiconductor substrate 10 on one side of the gate 20, and a drain D disposed in the semiconductor substrate 10 on the other side of the gate 20. The HVMOS transistor 1 further comprises a channel region 130 between the source S and the drain D. According to the embodiment, the first discrete segment 201 and the second discrete segment 202 are disposed directly on the channel region 130. The gap 210 between the first discrete segment 201 and the second discrete segment 202 may be situated directly on the channel region 130.

According to the embodiment, the HVMOS transistor 1 further comprises an annular guard ring doping region 30 having first conductivity type, for example, P type. The guard ring doping region 30 is disposed in the semiconductor substrate 10 and surrounds the gate 20, the source S, and the drain D.

According to the embodiment, the semiconductor substrate 10 has first conductivity type, for example, P type. According to the embodiment, an ion well 11 having first conductivity type, for example, P type, is disposed in the semiconductor substrate 10. The semiconductor substrate 10 may be, for example, a silicon substrate, a Si-containing substrate (such as SiC), a III-V group substrate (such as GaN), a III-V group-on-silicon substrate (such as GaN-on-silicon), a graphene-on-silicon substrate, a silicon-on-insulator (SOI) substrate, an epitaxial layer containing substrate, or other suitable semiconductor substrates, but not limited thereto.

According to the embodiment, the source S comprises a first drift well 101 having second conductivity type, for example, N type, in the ion well 11. The first drift well 101 is partially overlapped with the gate 20. According to the embodiment, the drain D comprises a second drift well 102 having second conductivity type, for example, N type, in the ion well 11. The second drift well 102 is partially overlapped with the gate 20. The channel region 130 is situated between the first drift well 101 and the second drift well 102.

According to the embodiment, the HVMOS transistor 1 may be a field-drift MOS transistor. The HVMOS transistor 1 may further comprise at least a first shallow trench isolation (STI) region 110 disposed in the first drift well 101 of the source S, and a second STI region 112 disposed in the second drift well 102 of the drain D. According to the embodiment, the HVMOS transistor 1 may further comprise a first heavily doped region 116 having second conductivity type, for example, N type, disposed in the first drift well 101 next to the first STI region 110, and a second heavily doped region 118 having second conductivity type, for example, N type, disposed in the second drift well 102 next to the second STI region 112.

Further, according to the embodiment, a contact etch stop layer (CESL) 310 and an inter-layer dielectric (ILD) layer 312 may be deposited on the semiconductor substrate 10. The CESL 310 conformally covers the surface of the spacer 22, the surface of the first STI region 110, the surface of the second STI region 112, the surface of the first heavily doped region 116, and the surface of the second heavily doped region 118. The ILD layer 312 covers the CESL 310.

According to the embodiment, the first discrete segment 201 and the second discrete segment 202 are electrically connected together through a metal layer, for example, M1 layer, such that the first discrete segment 201 and the second discrete segment 202 are coupled to the same gate voltage $V_G$.

It is one germane feature of the claimed invention that the large-size metal gate is divided into several (at least two) discrete blocks (or segments). Each block (or segment) has a maximum dimension or length that is not greater than 2 µm. Therefore, the gate dishing issue that typically occurs in the gate-last processes can be avoided. It is another feature that these discrete blocks (or segments) are electrically connected together through plugs and metal layers (e.g. M1).

Figure 3:
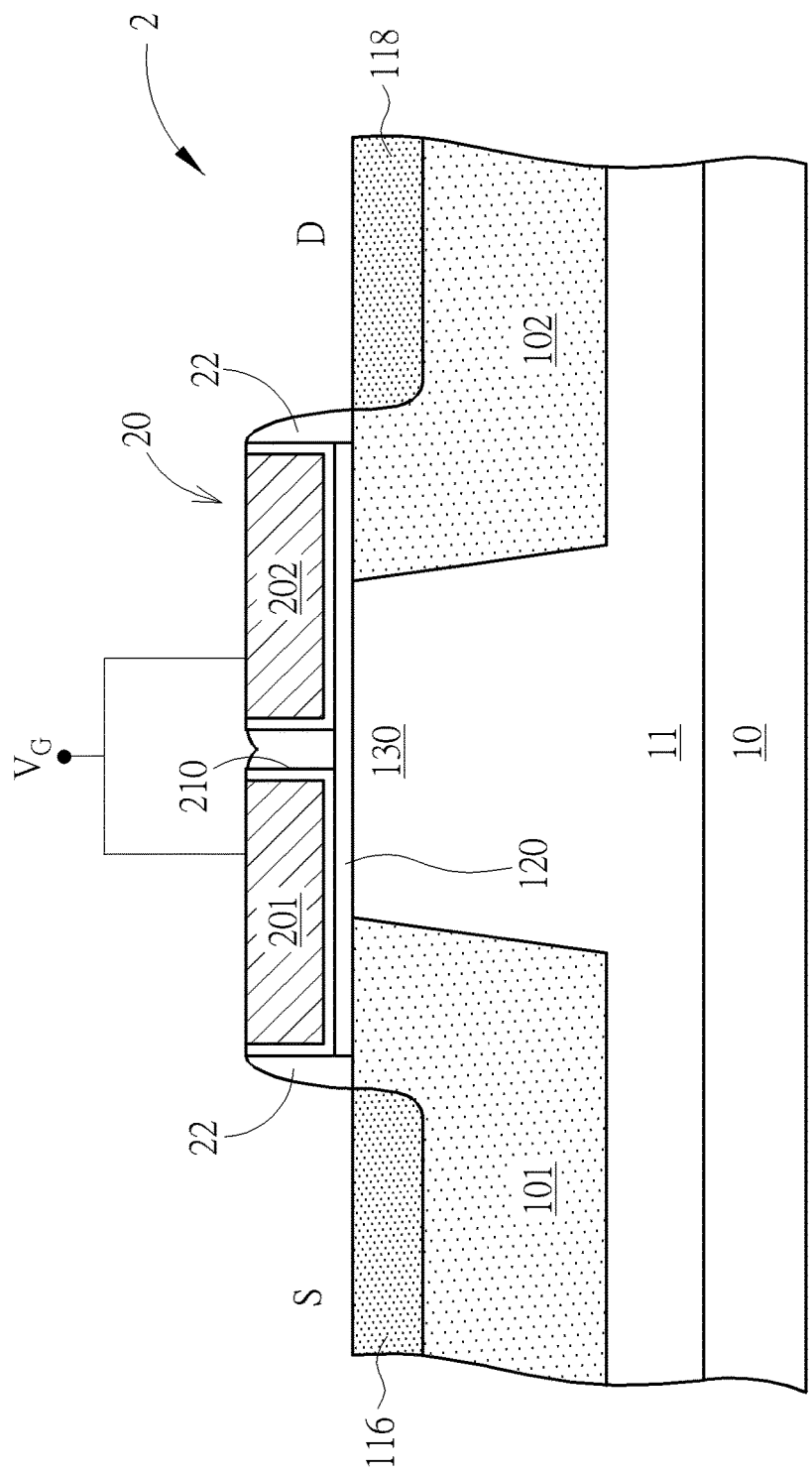
FIG. 3 is a schematic, cross-sectional diagram showing a HVMOS transistor in accordance with another embodiment of the invention.

FIG. 3 is a schematic, cross-sectional diagram showing a HVMOS transistor in accordance with another embodiment of the invention, wherein like numeral numbers designate like regions, layers, or elements. As shown in FIG. 3, according to the embodiment, the HVMOS transistor 2 may be a double diffused drain (DDD) MOS transistor, which comprises a semiconductor substrate 10, a gate oxide layer 120 disposed on the semiconductor substrate 10, and a gate 20 disposed on the gate oxide layer 120.

According to the embodiment, the gate 20 is a metal gate. Likewise, the gate 20 comprises at least a first discrete segment 201 and a second discrete segment 202 that is disposed in close proximity to the first discrete segment 201. The first discrete segment 201 is not in direct contact with the second discrete segment 202. The first discrete segment 201 and the second discrete segment 202 are coplanar. Both of the first discrete segment 201 and the second discrete segment 202 comprise metal, for example, word function metal, barrier metal, low-resistance metal, or the like.

According to the embodiment, each sidewall of the gate 20 is covered with a spacer 22. A gap 210 between the first discrete segment 201 and the second discrete segment 202 is filled with the spacer 22. According to the embodiment, the gap 210 may be completely filled up with the spacer 22. According to the embodiment, the spacer 22 may comprise silicon oxide, silicon nitride, oxide-nitride-oxide (ONO), nitrogen-doped silicon carbide (SiCN), or the like.

According to the embodiment, the HVMOS transistor 2 may comprise a source S disposed in the semiconductor substrate 10 on one side of the gate 20, and a drain D disposed in the semiconductor substrate 10 on the other side of the gate 20. The HVMOS transistor 2 further comprises a channel region 130 between the source S and the drain D. According to the embodiment, the first discrete segment 201 and the second discrete segment 202 are disposed directly on the channel region 130. The gap 210 between the first discrete segment 201 and the second discrete segment 202 may be situated directly on the channel region 130.

According to the embodiment, the semiconductor substrate 10 has first conductivity type, for example, P type. According to the embodiment, an ion well 11 having first conductivity type, for example, P type, is disposed in the semiconductor substrate 10. The semiconductor substrate 10 may be, for example, a silicon substrate, a Si-containing substrate (such as SiC), a III-V group substrate (such as GaN), a III-V group-on-silicon substrate (such as GaN-on-silicon), a graphene-on-silicon substrate, a silicon-on-insulator (SOI) substrate, an epitaxial layer containing substrate, or other suitable semiconductor substrates, but not limited thereto.

According to the embodiment, the source S comprises a first drift well 101 having second conductivity type, for example, N type, in the ion well 11. The first drift well 101 is partially overlapped with the gate 20. According to the embodiment, the drain D comprises a second drift well 102 having second conductivity type, for example, N type, in the ion well 11. The second drift well 102 is partially overlapped with the gate 20. The channel region 130 is situated between the first drift well 101 and the second drift well 102. The source S further comprises a first heavily doped region 116 having second conductivity type, for example, N type, disposed in the first drift well 101. The drain D further comprises a second heavily doped region 118 having second conductivity type, for example, N type, disposed in the second drift well 102.

According to the embodiment, the first discrete segment 201 and the second discrete segment 202 are electrically connected together through a metal layer, for example, M1 layer, such that the first discrete segment 201 and the second discrete segment 202 are coupled to the same gate voltage $V_G$.

Figure 4:
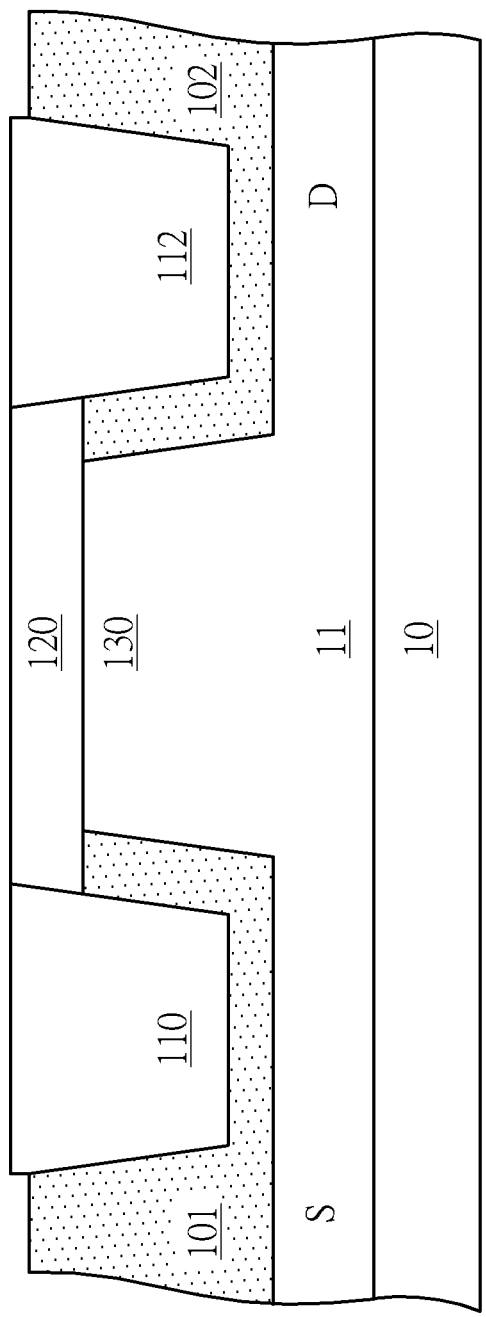
FIG. 4 to FIG. 10 are schematic, cross-sectional diagrams showing a method for fabricating a HVMOS transistor according to another embodiment of the invention.

Please refer to FIG. 4 to FIG. 10. FIG. 4 to FIG. 10 are schematic, cross-sectional diagrams showing a method for fabricating a high-voltage MOS (HVMOS) transistor according to another embodiment of the invention. As shown in FIG. 4, first, a semiconductor substrate is provided. The semiconductor substrate 10 has a first conductivity type, for example, P type. An ion well 11 is formed in the semiconductor substrate 10. The ion well 11 has the first conductivity type. A first drift well 101 is formed in the ion well 11. The first drift well 101 has a second conductivity type, for example, N type. A second drift well 102 is disposed in proximity to the first drift well 101. The second drift well 102 has the second conductivity type. A channel region 130 is situated between the first drift well 101 and the second drift well 102. Subsequently, a gate oxide layer 120 is formed on the semiconductor substrate 10 between the first shallow trench isolation (STI) region 110 and the second STI region 112.

Figure 5:
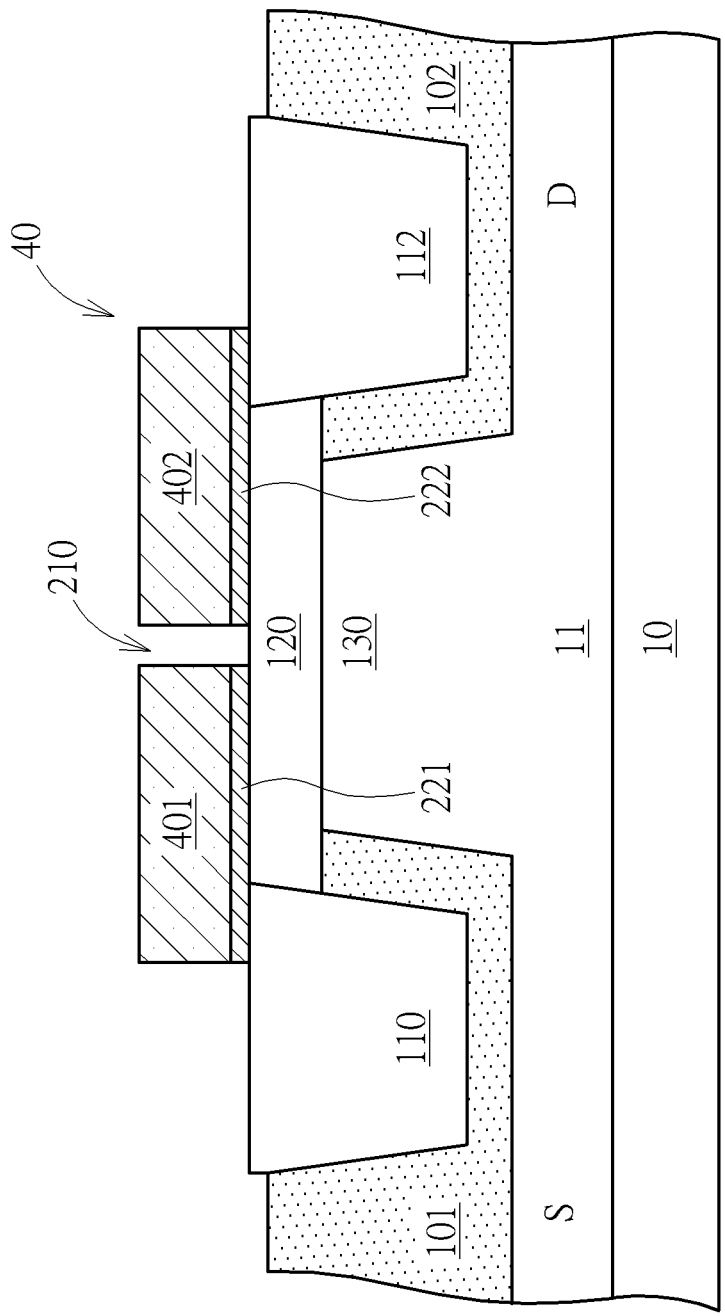

As shown in FIG. 5, a dummy gate 40 such as a dummy polysilicon gate is formed on the gate oxide layer 120. The dummy gate 40 comprises at least a first dummy segment 401 and a second dummy segment 402 that is disposed in close proximity to the first dummy segment 401. The first dummy segment 401 is not in direct contact with the second dummy segment 402. A gap 210 is formed between the first dummy segment 401 and the second dummy segment 402.

A first high dielectric constant (HK) layer 221 may be disposed between the first dummy segment 401 and the gate oxide layer 120, and a second high dielectric constant layer 222 may be disposed between the second dummy segment 402 and the gate oxide layer 120. According to the embodiment, the first high dielectric constant layer 221 is not in direct contact with the second high dielectric constant layer 222. According to the embodiment, the first high dielectric constant layer 221 and the second high dielectric constant layer 222 may comprise $HfO_x$, $HfSiO_x$, HfSiON, $ZrO_2$, $HfZrO_x$, $AlO_x$, or $TiO_x$, but is not limited thereto.

Figure 6:
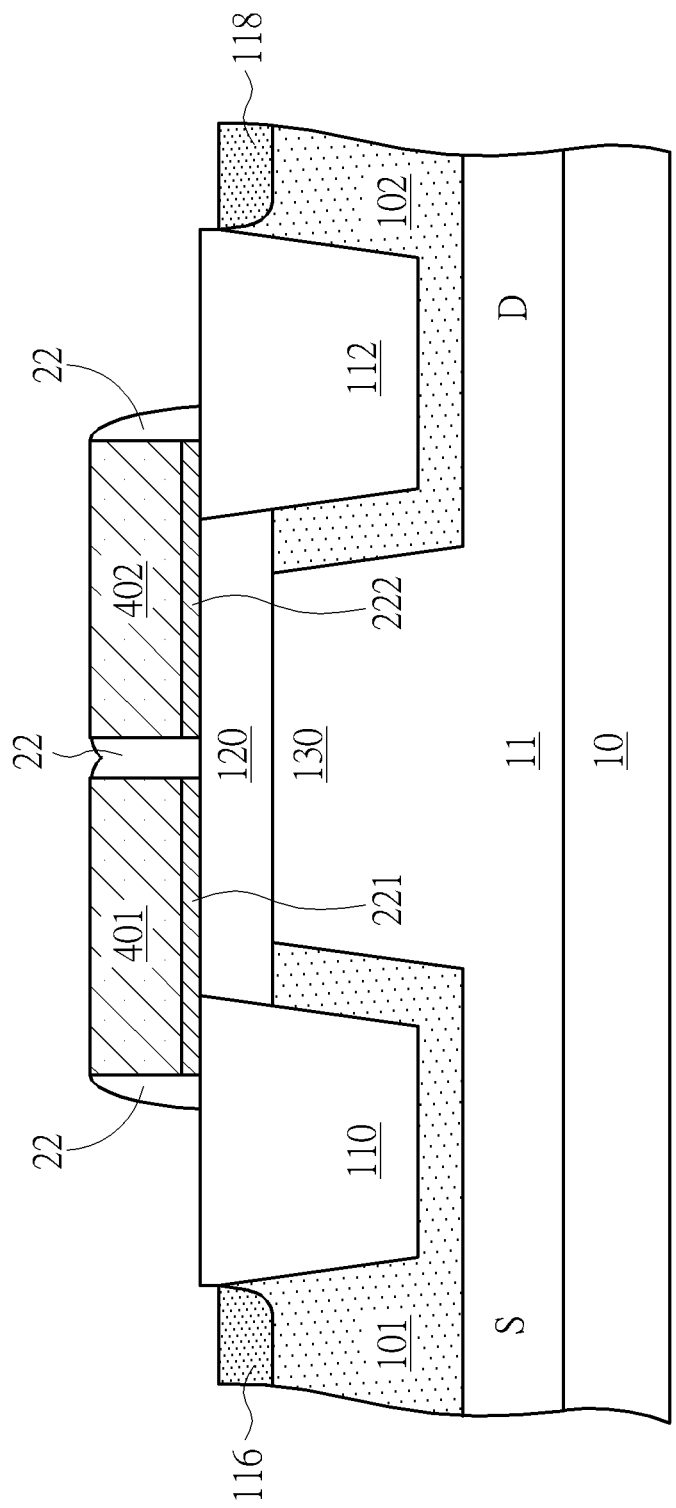

Subsequently, as shown in FIG. 6, a spacer 22 is formed on each sidewall of the dummy gate 40. The gap 210 between the first dummy segment 401 and the second dummy segment 402 is filled with the spacer 22. According to the embodiment, the spacer 22 may comprise silicon oxide, silicon nitride, oxide-nitride-oxide (ONO), nitrogen-doped silicon carbide (SiCN), or the like. After the formation of the spacer 22, an ion implantation process is carried out to form a first heavily doped region 116 and a second heavily doped region 118 in the first drift well 101 and the second drift well 102, respectively.

Figure 7:
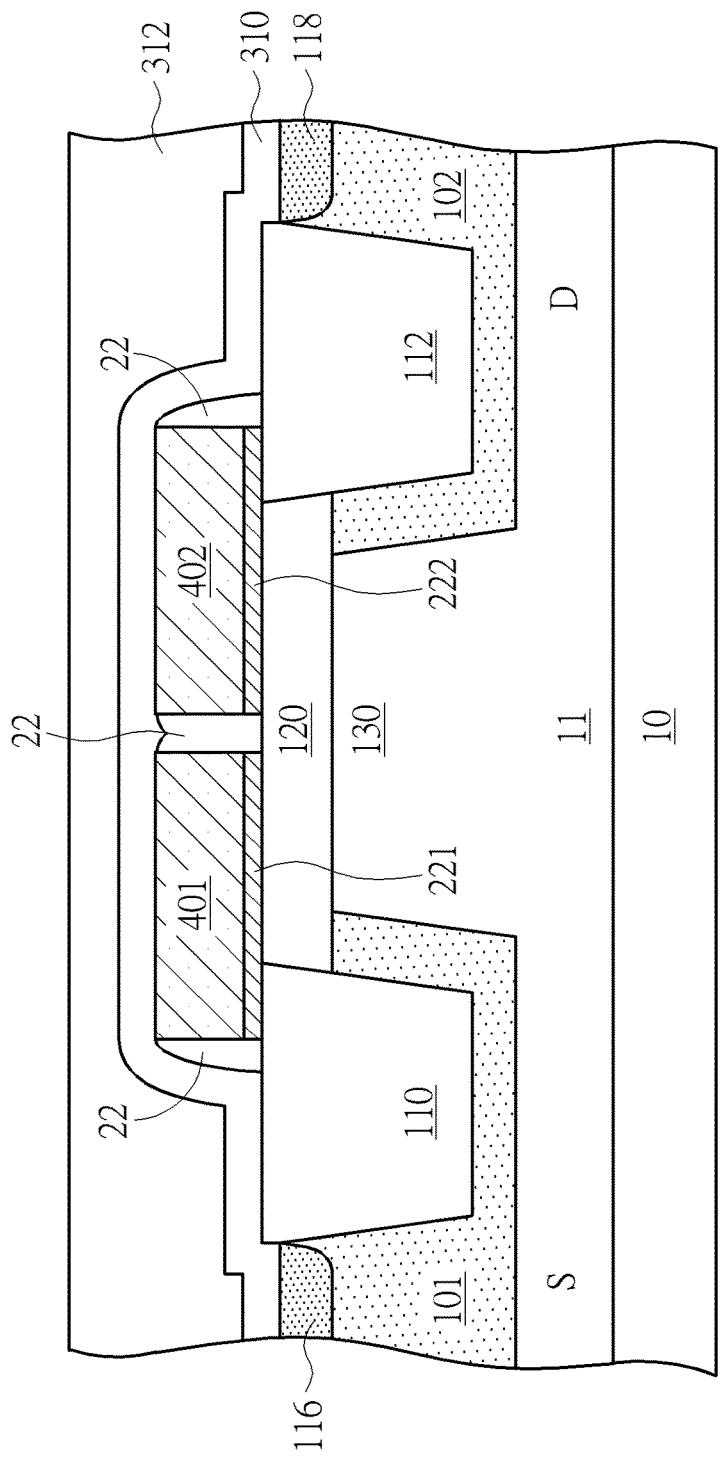

Subsequently, as shown in FIG. 7, a contact etch stop layer (CESL) 310, such as a silicon nitride layer, may be deposited on the first dummy segment 401, the second dummy segment 402, and the spacer 22. Thereafter, an inter-layer dielectric (ILD) layer 312, such as PSG, BSG, BPSG, or low-k materials, may be deposited on the CESL 310.

Figure 8:
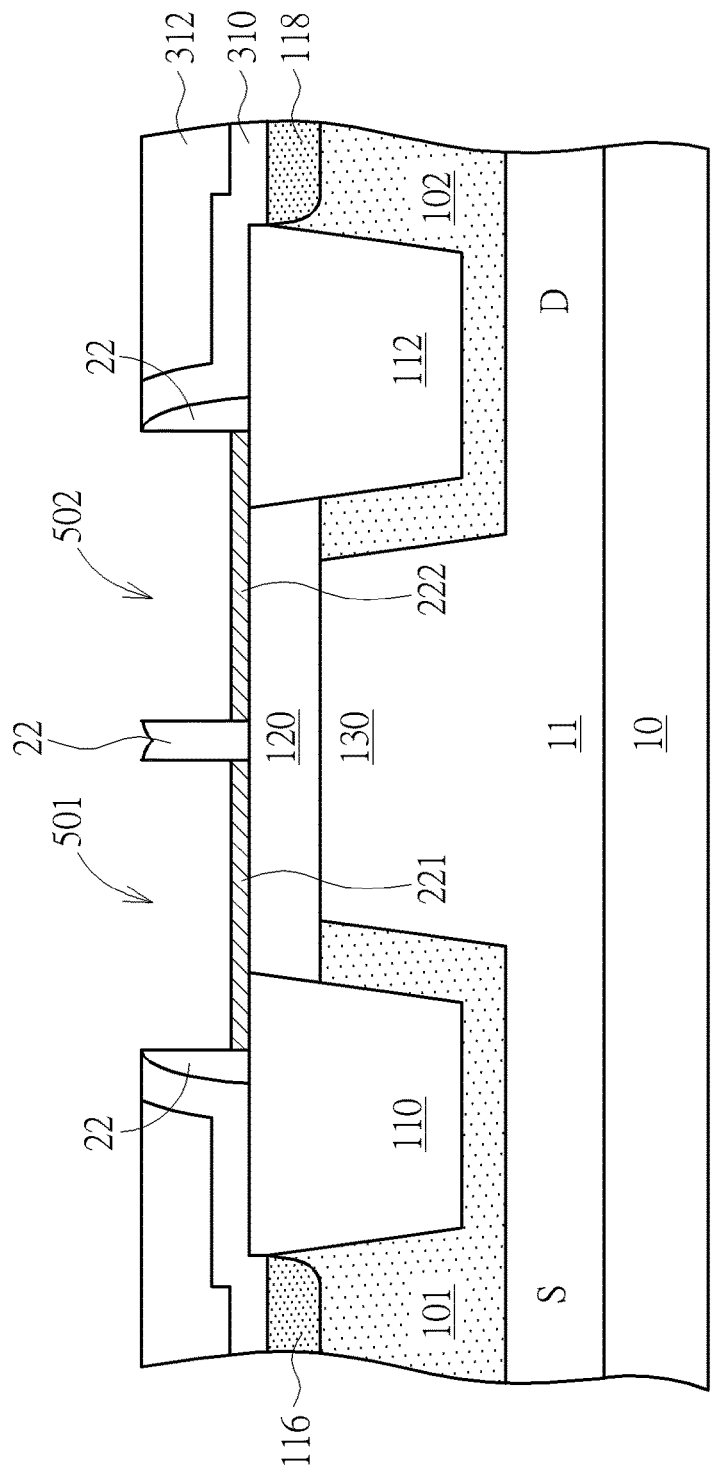

As shown in FIG. 8, a grinding process or a polishing process is carried out to polish the ILD layer 312 and the CESL 310 until the first dummy segment 401 and the second dummy segment 402 are revealed. Subsequently, the first dummy segment 401 and the second dummy segment 402 are removed to thereby form a first gate trench 501 and a second gate trench 502.

Figure 9:
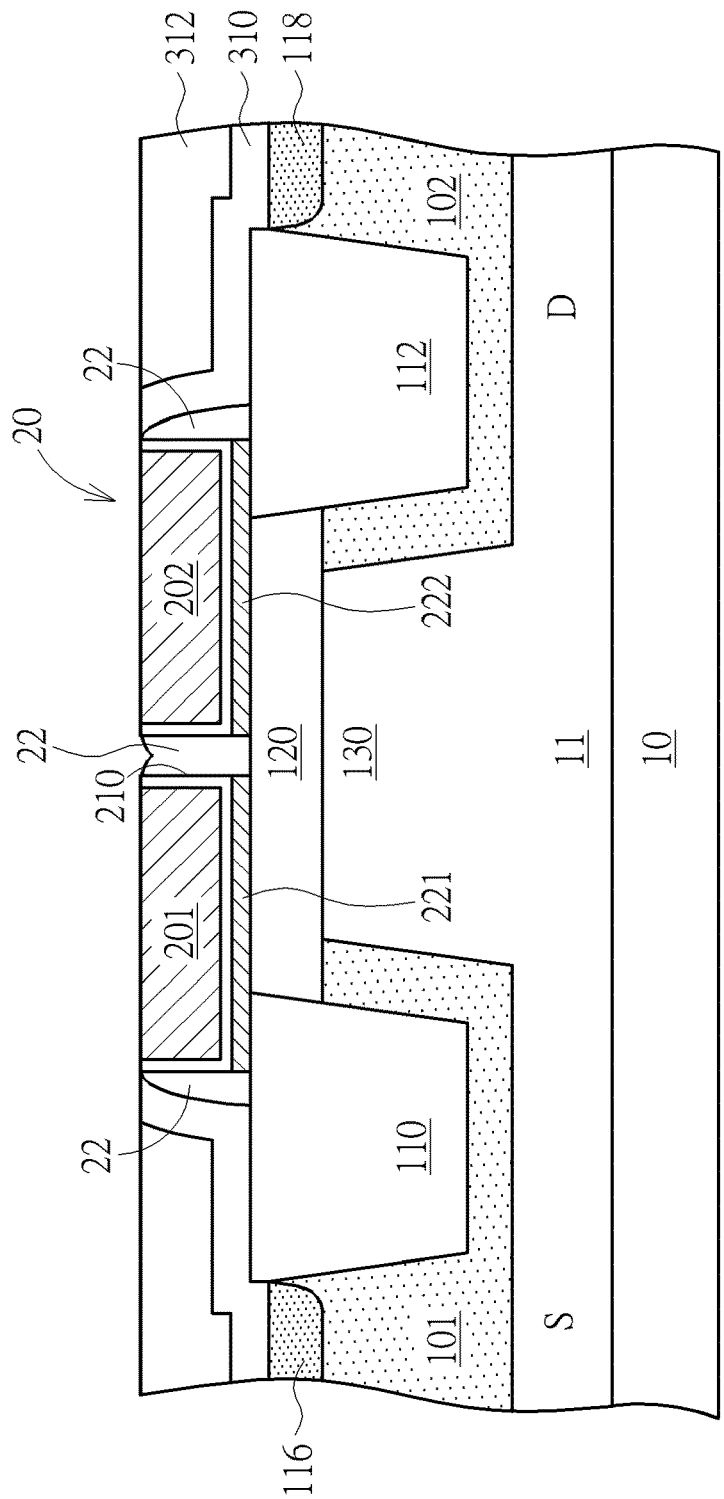

As shown in FIG. 9, a gate 20 is formed within the first gate trench 501 and the second gate trench 502. The gate 20 comprises at least a first discrete segment 201 and a second discrete segment 202. The first discrete segment 201 is not in direct contact with the second discrete segment 202. The first discrete segment 201 and the second discrete segment 202 are coplanar. Both of the first discrete segment 201 and the second discrete segment 202 comprise metal, for example, word function metal, barrier metal, low-resistance metal, or the like.

Figure 10:
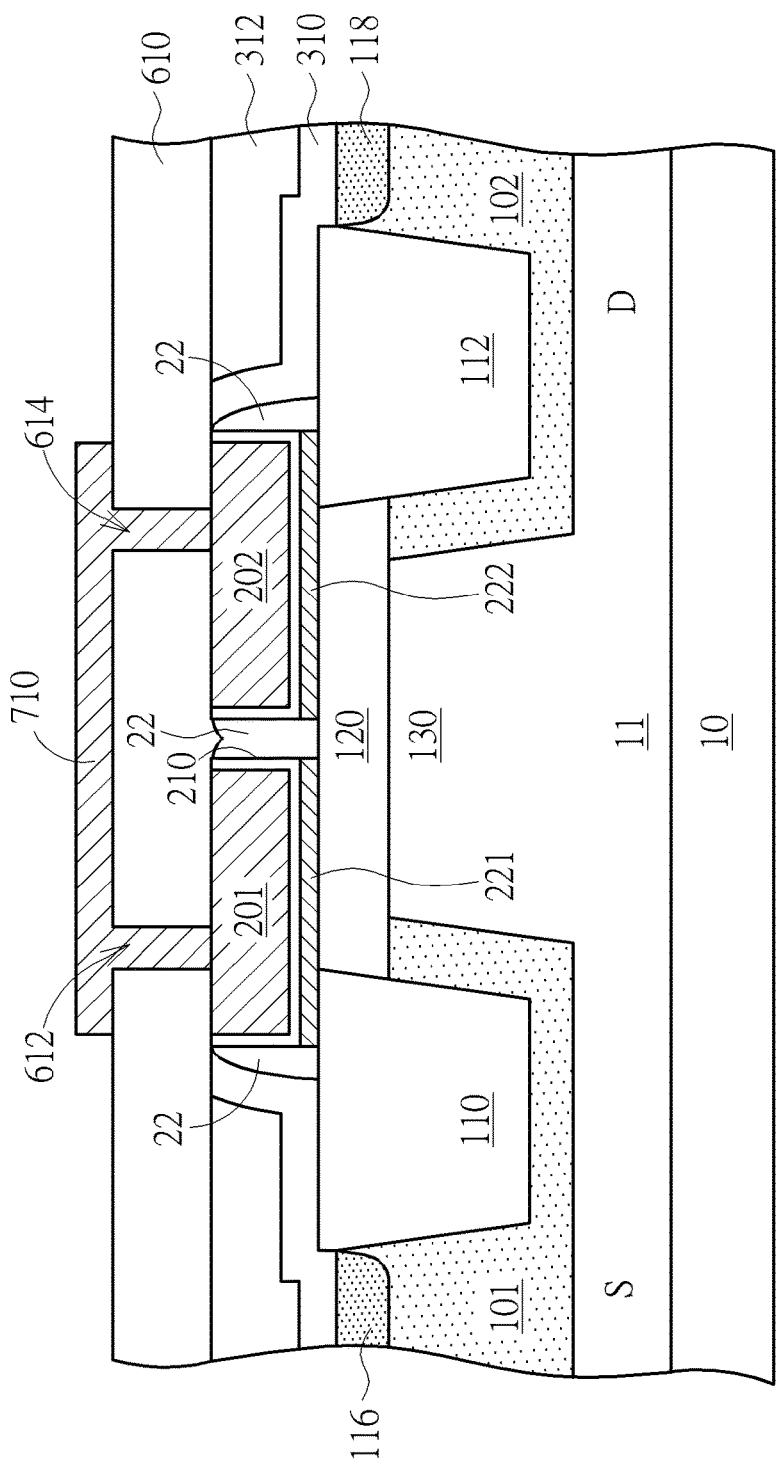

As shown in FIG. 10, after forming the gate 20, a dielectric layer 610 is deposited on the gate 20 and the ILD layer 312. Subsequently, a contact plug 612 and a contact plug 614 are formed in the dielectric layer 610. The contact plug 612 is directly disposed above the first discrete segment 201 and is electrically connected to the first discrete segment 201. The contact plug 614 is directly disposed above the second discrete segment 202 and is electrically connected to the second discrete segment 202. A metal layer 710 is then formed on the contact plug 612 and the contact plug 614. According to the embodiment, the metal layer 710 electrically connects the contact plug 612 with the contact plug 614.

Although FIG. 4 to FIG. 10 illustrate an exemplary high-k first (HK-first) process, it is to be understood to those skilled in the art that that the present invention may be applicable to the high-k last (HK-last) process, wherein the HK layer is formed after the dummy gate is removed.

Figure 11:
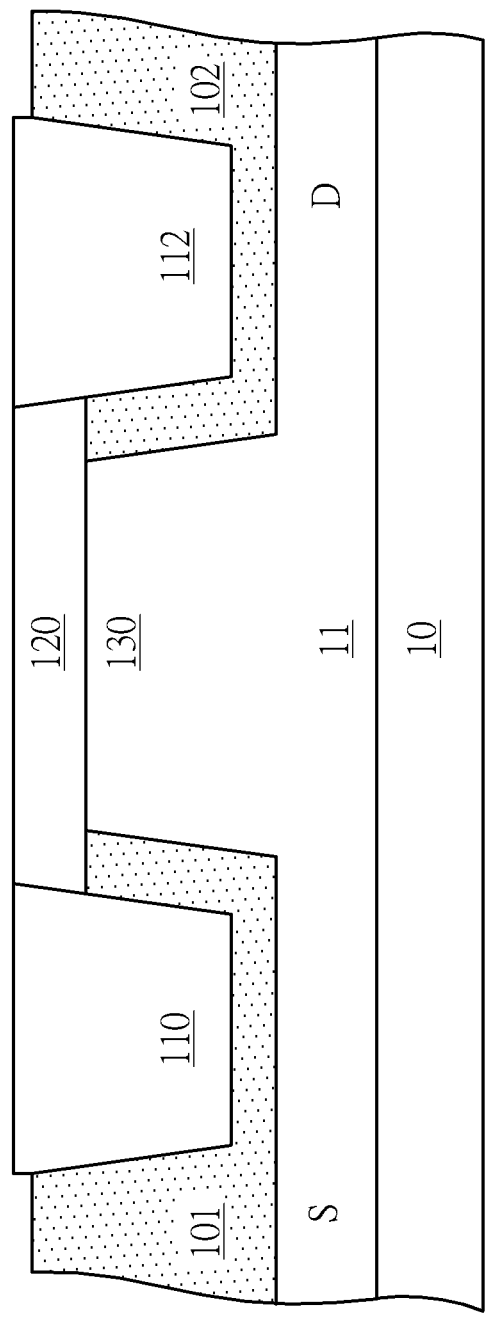
FIG. 11 to FIG. 16 are schematic, cross-sectional diagrams showing a method for fabricating a HVMOS transistor utilizing a HK-last process according to another embodiment of the invention.

FIG. 11 to FIG. 16 are schematic, cross-sectional diagrams showing a method for fabricating a high-voltage MOS (HVMOS) transistor utilizing a HK-last process according to another embodiment of the invention, wherein like numeral numbers designate like regions, elements, and material layers. As shown in FIG. 11, likewise, a semiconductor substrate 10 is provided. The semiconductor substrate 10 has a first conductivity type, for example, P type. An ion well 11 is formed in the semiconductor substrate 10. The ion well 11 has the first conductivity type. A first drift well 101 is formed in the ion well 11. The first drift well 101 has a second conductivity type, for example, N type. A second drift well 102 is disposed in proximity to the first drift well 101. The second drift well 102 has the second conductivity type. A channel region 130 is situated between the first drift well 101 and the second drift well 102. Subsequently, a gate oxide layer 120 is formed on the semiconductor substrate 10 between the first shallow trench isolation (STI) region 110 and the second STI region 112.

Figure 12:
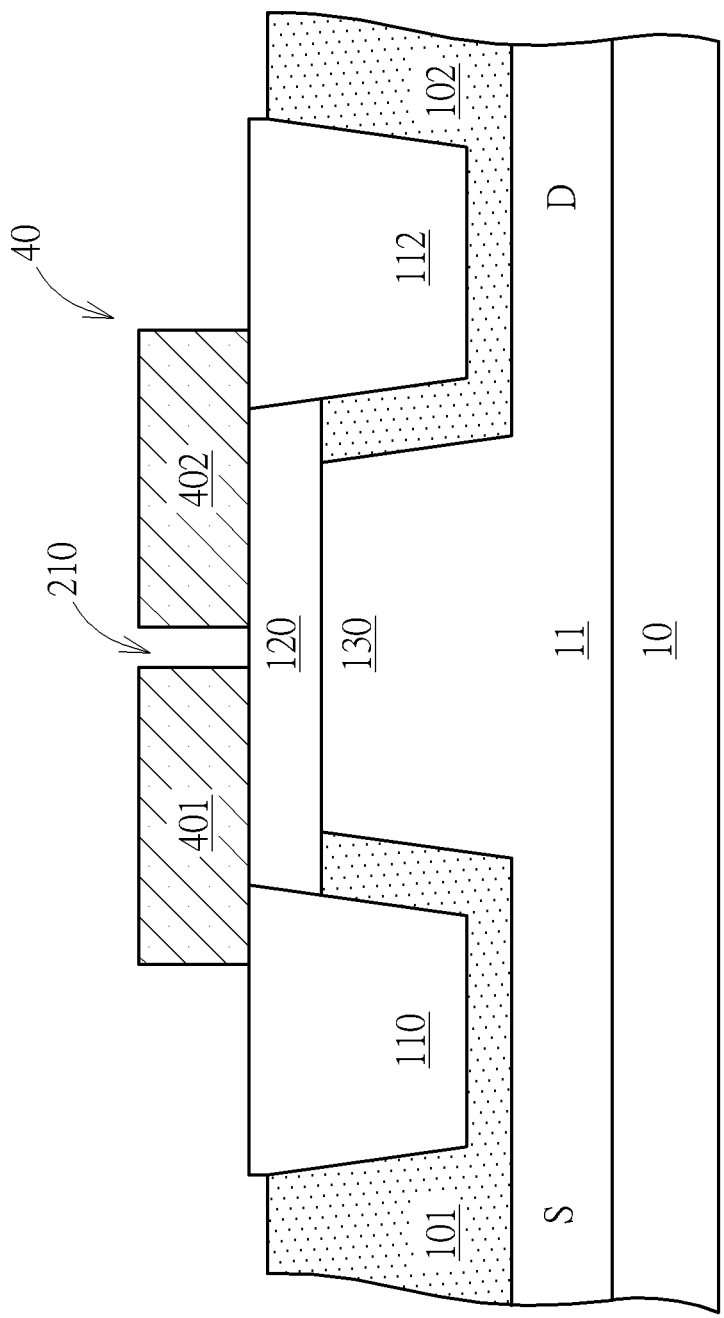

As shown in FIG. 12, a dummy gate 40 such as a dummy polysilicon gate is formed on the gate oxide layer 120. The dummy gate 40 comprises at least a first dummy segment 401 and a second dummy segment 402 that is disposed in close proximity to the first dummy segment 401. The first dummy segment 401 is not in direct contact with the second dummy segment 402. A gap 210 is formed between the first dummy segment 401 and the second dummy segment 402. The dummy gate 40 may be formed directly on the gate oxide layer 120.

Figure 13:
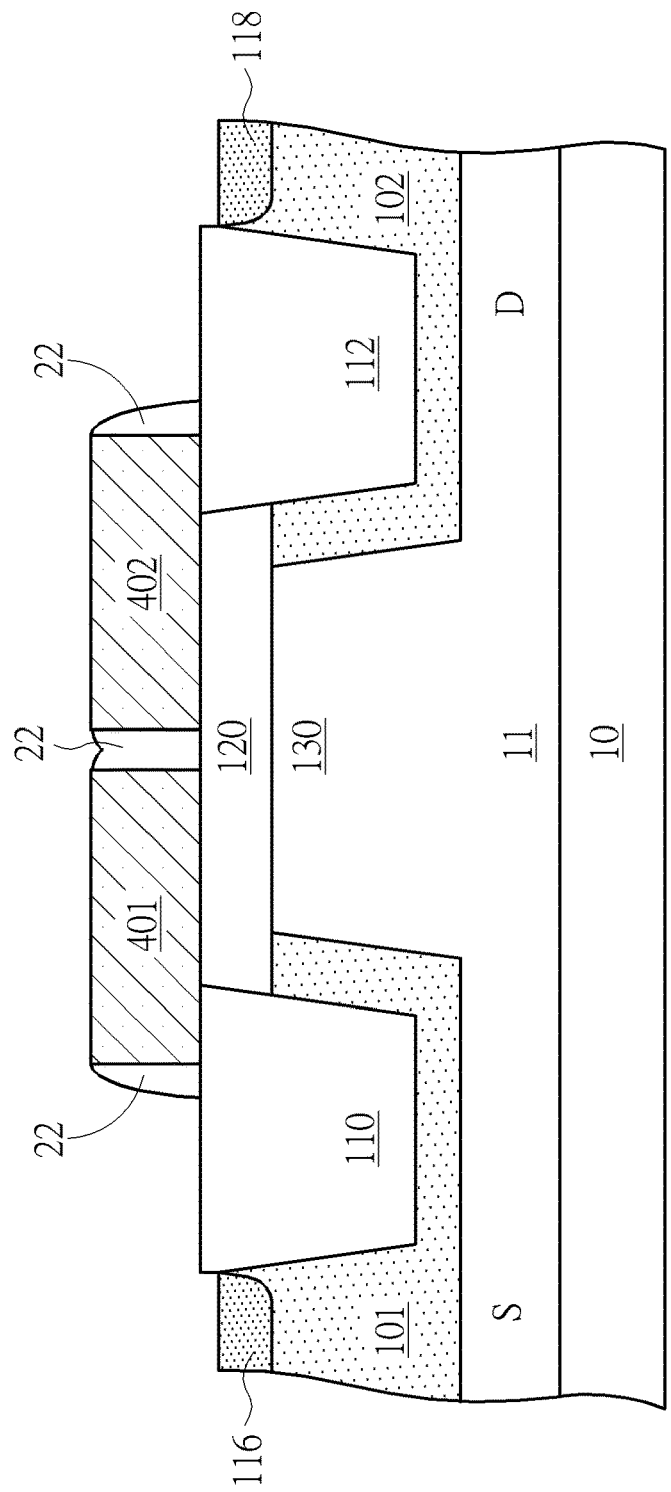

Subsequently, as shown in FIG. 13, a spacer 22 is formed on each sidewall of the dummy gate 40. The gap 210 between the first dummy segment 401 and the second dummy segment 402 is filled with the spacer 22. According to the embodiment, the spacer 22 may comprise silicon oxide, silicon nitride, oxide-nitride-oxide (ONO), nitrogen-doped silicon carbide (SiCN), or the like. After the formation of the spacer 22, an ion implantation process is carried out to form a first heavily doped region 116 and a second heavily doped region 118 in the first drift well 101 and the second drift well 102, respectively.

Figure 14:
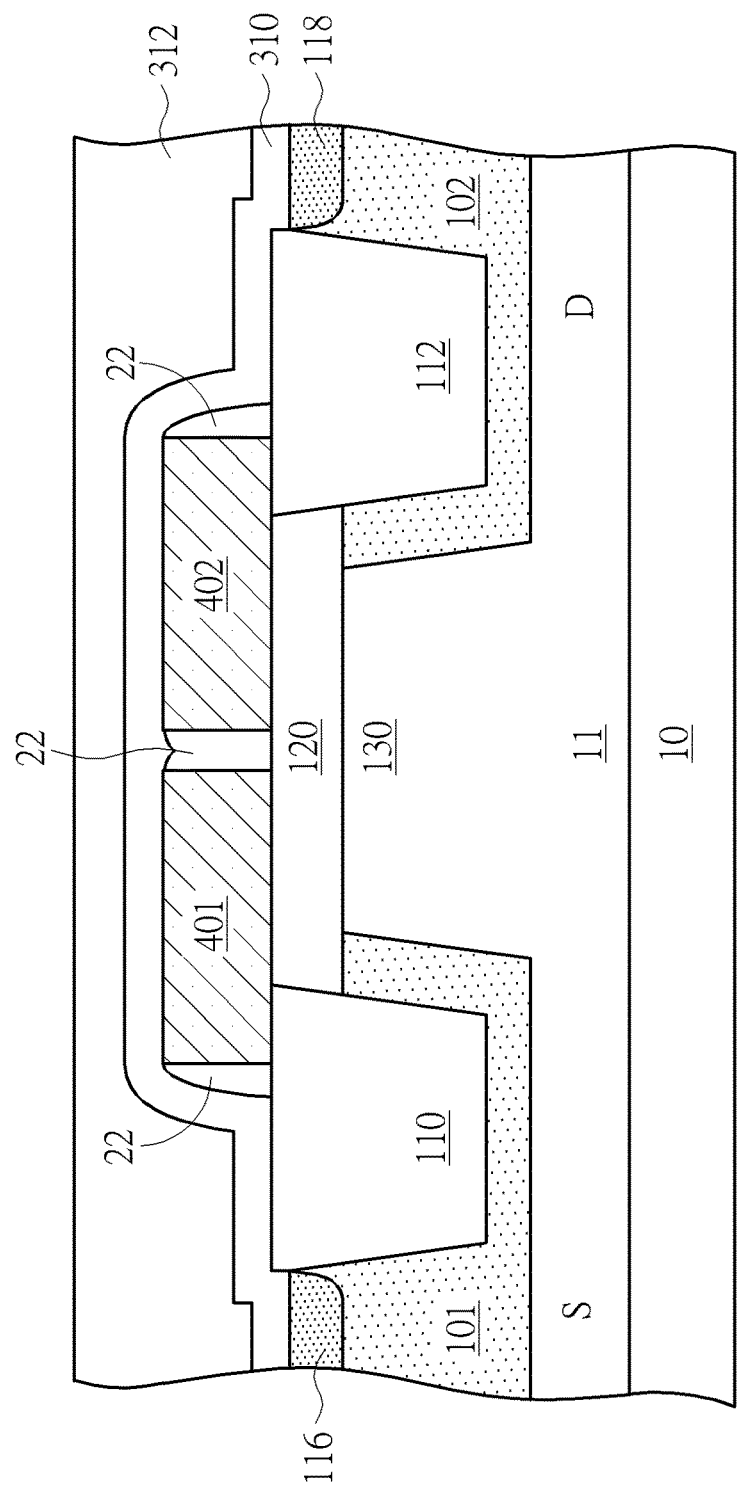

Subsequently, as shown in FIG. 14, a contact etch stop layer (CESL) 310, such as a silicon nitride layer, may be deposited on the first dummy segment 401, the second dummy segment 402, and the spacer 22. Thereafter, an inter-layer dielectric (ILD) layer 312, such as PSG, BSG, BPSG, or low-k materials, may be deposited on the CESL 310.

Figure 15:
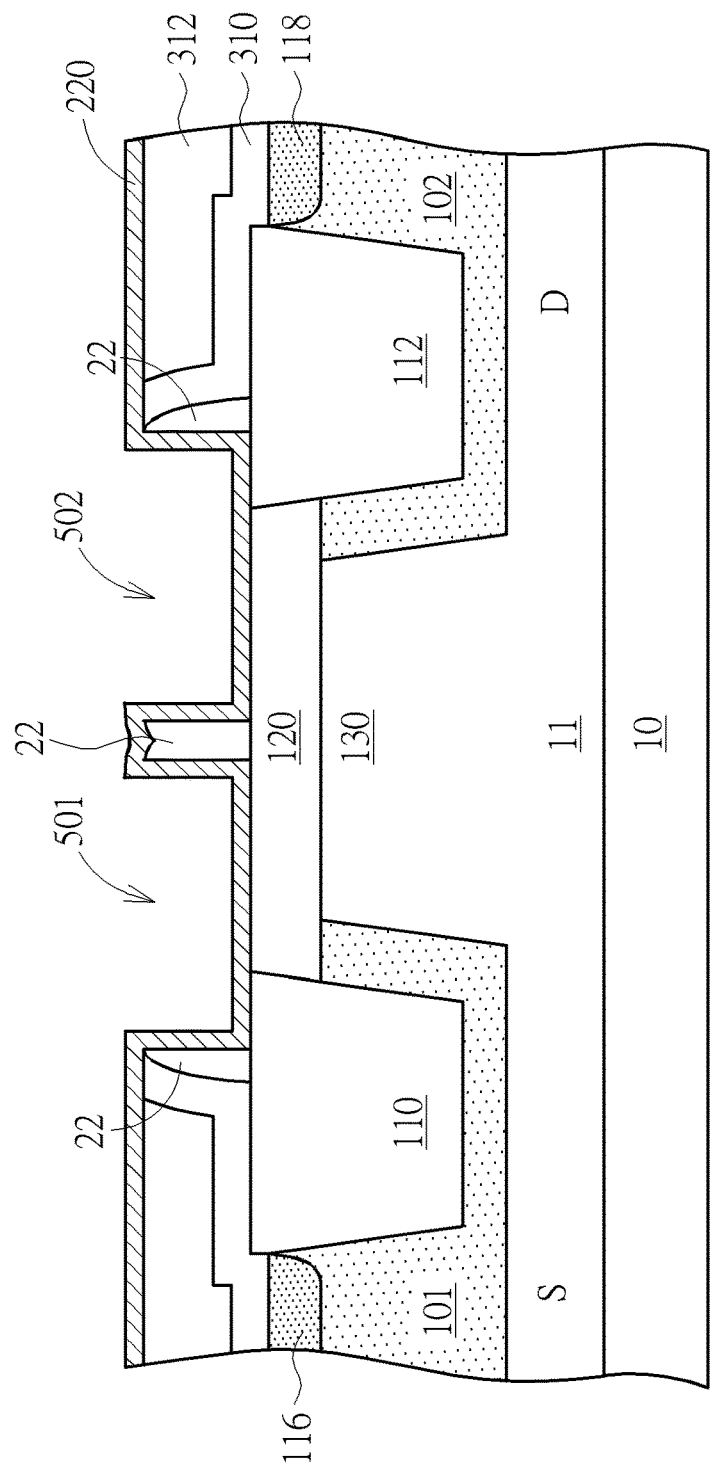

As shown in FIG. 15, a grinding process or a polishing process is carried out to polish the ILD layer 312 and the CESL 310 until the first dummy segment 401 and the second dummy segment 402 are revealed. Subsequently, the first dummy segment 401 and the second dummy segment 402 are removed to thereby form a first gate trench 501 and a second gate trench 502. A high dielectric constant layer 220 is conformally deposited on the ILD layer 312, and in the first gate trench and the second gate trench 502. According to the embodiment, the high dielectric constant layer 220 may comprise $HfO_x$, $HfSiO_x$, $HfSiON$, $ZrO_2$, $HfZrO_x$, $AlO_x$, or $TiO_x$, but is not limited thereto.

Figure 16:
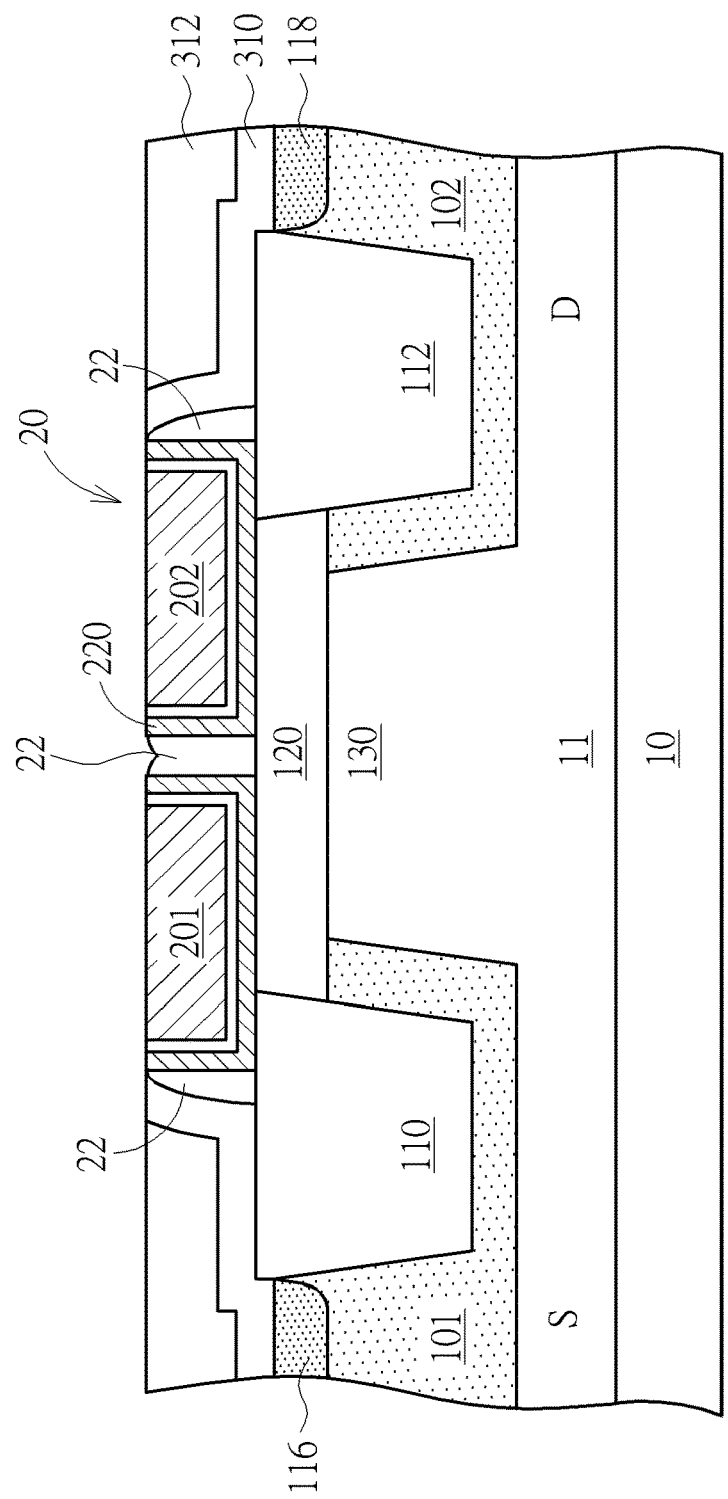

As shown in FIG. 16, a gate 20 is formed within the first gate trench 501 and the second gate trench 502. The gate 20 comprises at least a first discrete segment 201 and a second discrete segment 202. The first discrete segment 201 is not in direct contact with the second discrete segment 202. The first discrete segment 201 and the second discrete segment 202 are coplanar. Both of the first discrete segment 201 and the second discrete segment 202 comprise metal, for example, word function metal, barrier metal, low-resistance metal, or the like.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a high-voltage MOS transistor, comprising:
   providing a semiconductor substrate;
   forming a gate oxide layer on the semiconductor substrate;
   forming a dummy gate on the gate oxide layer, wherein the dummy gate comprises at least a first dummy segment and a second dummy segment, wherein the first dummy segment is not in direct contact with the second dummy segment;
   forming a spacer on a sidewall of the dummy gate, wherein the spacer fills into a gap between the first dummy segment and the second dummy segment;
   forming a contact etch stop layer (CESL) on the first dummy segment, the second dummy segment, and the spacer;
   depositing at least one dielectric layer on the CESL;

polishing the dielectric layer and the CESL to reveal the first dummy segment and the second dummy segment;

removing the first dummy segment and the second dummy segment to form a first gate trench and a second gate trench; and forming a metal gate in the first gate trench and the second gate trench, wherein the metal gate comprises at least a first discrete segment and a second discrete segment, and wherein the first discrete segment is not in direct contact with the second segment, wherein the first and second segments are electrically connected together to a metal layer.

2. The method for fabricating a high-voltage MOS transistor according to claim 1, wherein after forming the metal gate in the first gate trench and the second gate trench, the method further comprises:

forming a first contact plug and a second contact plug on the first discrete segment and the second discrete segment, respectively; and forming the metal layer electrically connecting the first contact plug with the second contact plug.

3. The method for fabricating a high-voltage MOS transistor according to claim 1, wherein a maximum dimension of the first discrete segment or the second discrete segment is not greater than a predetermined value.

4. The method for fabricating a high-voltage MOS transistor according to claim 3, wherein the predetermined value is 2 μm.

5. The method for fabricating a high-voltage MOS transistor according to claim 1, wherein the semiconductor substrate has a first conductivity type, and an ion well having the first conductivity type is disposed in the semiconductor substrate, wherein a first drift well having a second conductivity type is formed in the ion well, and wherein a second drift well having the second conductivity type is disposed in the ion well in proximity to the first drift well, and wherein a channel region is situated between the first drift well and the second drift well.

6. The method for fabricating a high-voltage MOS transistor according to claim 1, wherein after forming the gate oxide layer on the semiconductor substrate and before forming the dummy gate on the gate oxide layer, the method further comprises:

forming a high dielectric constant layer on the gate oxide layer.

7. The method for fabricating a high-voltage MOS transistor according to claim 1, wherein after removing the first dummy segment and the second dummy segment to form the first gate trench and the second gate trench and before forming the metal gate in the first gate trench and the second gate trench, the method further comprises:

forming a high dielectric constant layer in the first gate trench and the second gate trench.

* * * * *